United States Patent
Oshima et al.

(10) Patent No.: US 10,424,634 B1
(45) Date of Patent: Sep. 24, 2019

(54) SEMICONDUCTOR DEVICE

(71) Applicant: TOSHIBA MEMORY CORPORATION, Minato-ku (JP)

(72) Inventors: Yasunori Oshima, Yokkaichi (JP); Takayuki Ito, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/039,885

(22) Filed: Jul. 19, 2018

(30) Foreign Application Priority Data

Mar. 9, 2018 (JP) .................................. 2018-043168

(51) Int. Cl.
*H01L 29/04* (2006.01)
*H01L 29/417* (2006.01)
*H01L 21/02* (2006.01)
*H01L 21/8234* (2006.01)

(52) U.S. Cl.
CPC ...... *H01L 29/045* (2013.01); *H01L 21/02667* (2013.01); *H01L 21/823418* (2013.01); *H01L 29/41783* (2013.01)

(58) Field of Classification Search
CPC ............. H01L 29/045; H01L 29/41783; H01L 21/02667; H01L 21/823418
USPC ........................................................ 257/627
See application file for complete search history.

(56) References Cited

U.S. PATENT DOCUMENTS

| 7,786,538 | B2 | 8/2010 | Tsuchiaki | |
|---|---|---|---|---|
| 7,915,693 | B2 | 3/2011 | Okano | |
| 7,951,680 | B2 * | 5/2011 | Zhang | H01L 29/0847 438/300 |
| 8,772,127 | B2 * | 7/2014 | Yin | H01L 29/66545 257/E21.546 |
| 2009/0026505 | A1 | 1/2009 | Okano | |
| 2009/0065877 | A1 | 3/2009 | Tsuchiaki | |
| 2013/0248942 | A1 | 9/2013 | Okano | |

FOREIGN PATENT DOCUMENTS

| JP | 2009-32955 | 2/2009 |
|---|---|---|
| JP | 2009-70971 | 4/2009 |
| JP | 2013-197342 | 9/2013 |

\* cited by examiner

*Primary Examiner* — Tu-Tu V Ho
(74) *Attorney, Agent, or Firm* — Oblon, McClelland, Maier & Neustadt, L.L.P.

(57) ABSTRACT

In a semiconductor device, a source and a drain layers are located in a surface region of a substrate. A source crystal layer is located in a contact region of the source layer to extend to a position higher than the substrate. A drain crystal layer is located in a contact region of the drain layer to extend to a position higher than the substrate. A source contact is located on the source crystal layer. A drain contact is located on the drain crystal layer. A gate width or a gate length extends to a crystal orientation <110> of the substrate. A long side or a major axis of the source crystal layer or a long side or a major axis of the drain crystal layer extends in a direction inclined with respect to the crystal orientation <110> in a planar layout parallel to the surface of the substrate.

14 Claims, 5 Drawing Sheets

SEMICONDUCTOR DEVICE

CROSS REFERENCE TO RELATED APPLICATIONS

This application is based upon and claims the benefit of priority from the prior Japanese Patent Application No. 2018-043168, filed on Mar. 9, 2018, the entire contents of which are incorporated herein by reference.

FIELD

The embodiments of the present invention relate to a semiconductor device.

BACKGROUND

In recent years, the gate length of transistors, the size of contacts, and the like have been greatly decreased with downscaling of a semiconductor device. In order to suppress the short channel effect of such downscaled transistors, raising the contact regions of sources and drains with an epitaxial layer to separate the contact positions from corresponding channel regions has been devised. Further, in order to reduce the contact resistance in this case, impurities are introduced into the epitaxial layer at a high concentration. During introduction of the impurities, crystals in the top part of the epitaxial layer are damaged and are amorphized. The epitaxial layer is thermally treated to recrystallize the resultant amorphous part and to activate the impurities.

Although the epitaxial layer is recrystallized at the time of the thermal treatment, the top end part of the epitaxial layer contains many stacking defects. Accordingly, a problem occurs that the contact resistance between contact plugs and the epitaxial layer is not sufficiently lowered even when the contact plugs are formed on the epitaxial layer.

DETAILED DESCRIPTION

Figure 1:
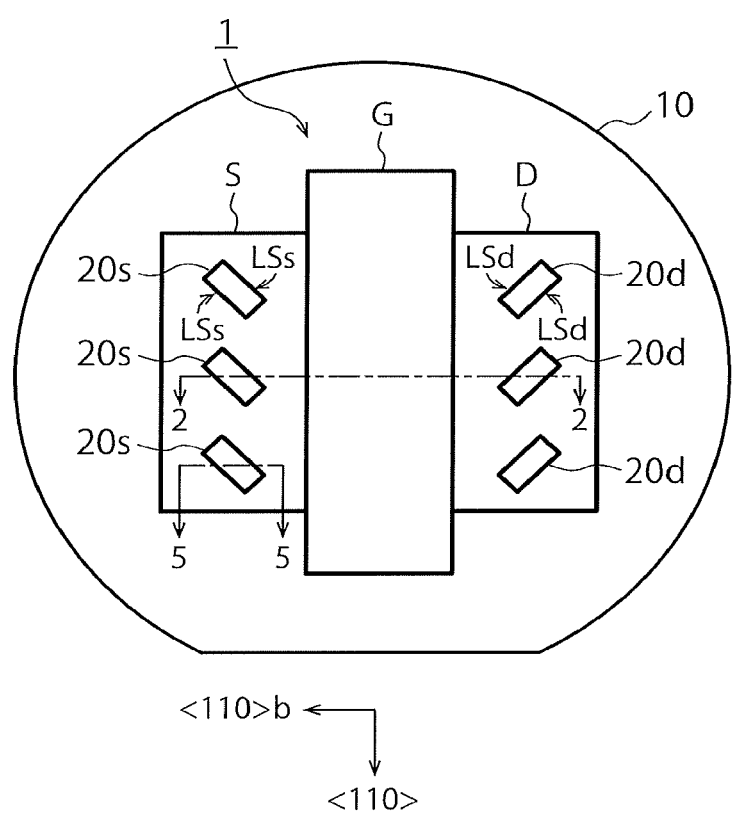
FIG. 1 is a plan view illustrating a configuration example of a transistor 1 according to a first embodiment.

Embodiments will now be explained with reference to the accompanying drawings. The present invention is not limited to the embodiments. In the embodiments, "an upper direction" or "a lower direction" refers to a relative direction when a direction of a surface of a semiconductor substrate on which semiconductor elements are provided is assumed as "an upper direction". Therefore, the term "upper direction" or "lower direction" occasionally differs from an upper direction or a lower direction based on a gravitational acceleration direction. The drawings are schematic or conceptual, and the ratios and the like among respective parts are not necessarily the same as those of actual products. In the present specification and the drawings, elements identical to those described in the foregoing drawings are denoted by like reference characters and detailed explanations thereof are omitted as appropriate.

A semiconductor device according to an embodiment comprises a semiconductor substrate. A source layer and a drain layer are located in a surface region of the semiconductor substrate. A gate dielectric film is located on a channel region between the source layer and the drain layer. A gate electrode is located on the gate dielectric film. A source crystal layer is located in a contact region of the source layer to extend to a position higher than a surface of the semiconductor substrate. A drain crystal layer is located in a contact region of the drain layer to extend to a position higher than the surface of the semiconductor substrate. A source contact is located on the source crystal layer. A drain contact is located on the drain crystal layer. A gate width or a gate length extends to a crystal orientation <110> of the semiconductor substrate. A long side or a major axis of the source crystal layer or a long side or a major axis of the drain crystal layer extends in a direction inclined with respect to the crystal orientation <110> in a planar layout parallel to the surface of the semiconductor substrate.

First Embodiment

FIG. 1 is a plan view illustrating a configuration example of a transistor 1 according to a first embodiment. The transistor 1 is a MOSFET (Metal Oxide Silicon Field-Effect Transistor) provided on a semiconductor substrate 10. Although one transistor 1 is drawn in a highlighted manner in FIG. 1, in practice, many transistors 1 are provided on the semiconductor substrate 10.

The semiconductor substrate 10 has a notch on a crystal plane (110) perpendicular to a crystal orientation <110>. A semiconductor material such as silicon is used as the semiconductor substrate 10.

A source layer S and a drain layer D of the transistor 1 are provided in a surface region of the semiconductor substrate 10 and are formed by introducing impurities into the semiconductor substrate 10. When the transistor 1 is a P-type MOSFET, the source layer S and the drain layer D are layers including P-type impurities (boron, for example) diffused therein. When the transistor 1 is an N-type MOSFET, the source layer S and the drain layer D are layers including N-type impurities (phosphorus or arsenic, for example) diffused therein.

A gate electrode G is provided above a channel region (CH in FIG. 2) between the source layer S and the drain layer D with a gate dielectric film (30 in FIG. 2) interposed therebetween. The gate electrode G extends in the crystal orientation <110> or crystal orientation <110>b and the gate width direction or the gate length direction substantially coincides with the crystal orientation <110> or <110>b. In FIG. 1, the gate width direction is the crystal orientation <110> and the gate length direction is the crystal orientation <110>b. Doped polysilicon or a conducting material such as metal is used as the gate electrode G. The crystal orientation <110>b is a direction orthogonal to the orientation <110> and "b" is added for the sake of convenience.

Source crystal layers 20s are provided on a contact region of the source layer S to extend to a position higher than the surface of the semiconductor substrate 10. The source crystal layers 20s are provided under source contact plugs (50s in FIG. 2), respectively. For example, a silicon single crystal obtained by introducing impurities into an epitaxial layer is used as the source crystal layers 20s.

Drain crystal layers 20d are provided on a contact region of the drain layer D to extend to a position higher than the surface of the semiconductor substrate 10. The drain crystal layers 20d are provided under drain contact plugs (50d in FIG. 2), respectively. For example, a silicon single crystal obtained by introducing impurities into an epitaxial layer is used as the drain crystal layers 20d.

The conductivity types of the impurities contained in the source crystal layers 20s and the drain crystal layers 20d are the same as that of the impurities contained in the source layer S and the drain layer D. Therefore, when the transistor 1 is a P-type MOSFET, P-type impurities are introduced into the source crystal layers 20s and the drain crystal layers 20d. When the transistor 1 is an N-type MOSFET, N-type impurities are introduced into the source crystal layers 20s and the drain crystal layers 20d.

The number of the source crystal layers 20s provided in one source layer S and the number of the drain crystal layers 20d provided in one drain layer D are not limited to three. Two or less, or four or more source crystal layers 20S or drain crystal layers 20d can be provided.

In the transistor 1 according to the present embodiment, long sides LSs of each of the source crystal layers 20s and long sides LSd of each of the drain crystal layers 20d extend in a direction inclined with respect to the crystal orientation <110> or <110>b in a planar layout parallel to the surface of the semiconductor substrate 10. For example, the long sides LSs of each of the source crystal layers 20s and the long sides LSd of each of the drain crystal layers 20d are inclined with respect to the crystal orientation <110> and <110>b at an angle of about 45 degrees in the planar layout. That is, in the planar layout, the long sides LSs of each of the source crystal layers 20s and the long sides LSd of each of the drain crystal layers 20d are inclined with respect to long sides or short sides of the gate electrode G (the gate width direction or the gate length direction) at an angle of about 45 degrees. The reason why the source crystal layers 20s and the drain crystal layers 20d are thus inclined with respect to the crystal orientation or the gate electrode G in the planar layout will be explained later. In the planar layout, the source crystal layers 20s and the drain crystal layers 20d have a rectangular shape in some cases and have an elliptical shape in other cases. When the source crystal layers 20s and the drain crystal layers 20d are rectangular, the long sides LSs and LSd are inclined with respect to the long sides or the short sides of the gate electrode G as described above. When the source crystal layers 20s and the drain crystal layers 20d are elliptical, it suffices that the major axes of the source crystal layers 20s and the drain crystal layers 20d are inclined with respect to the long sides or the short sides of the gate electrode G. Further, the 45 degrees of the inclination angle described above are an angle including a manufacturing error.

Figure 2:
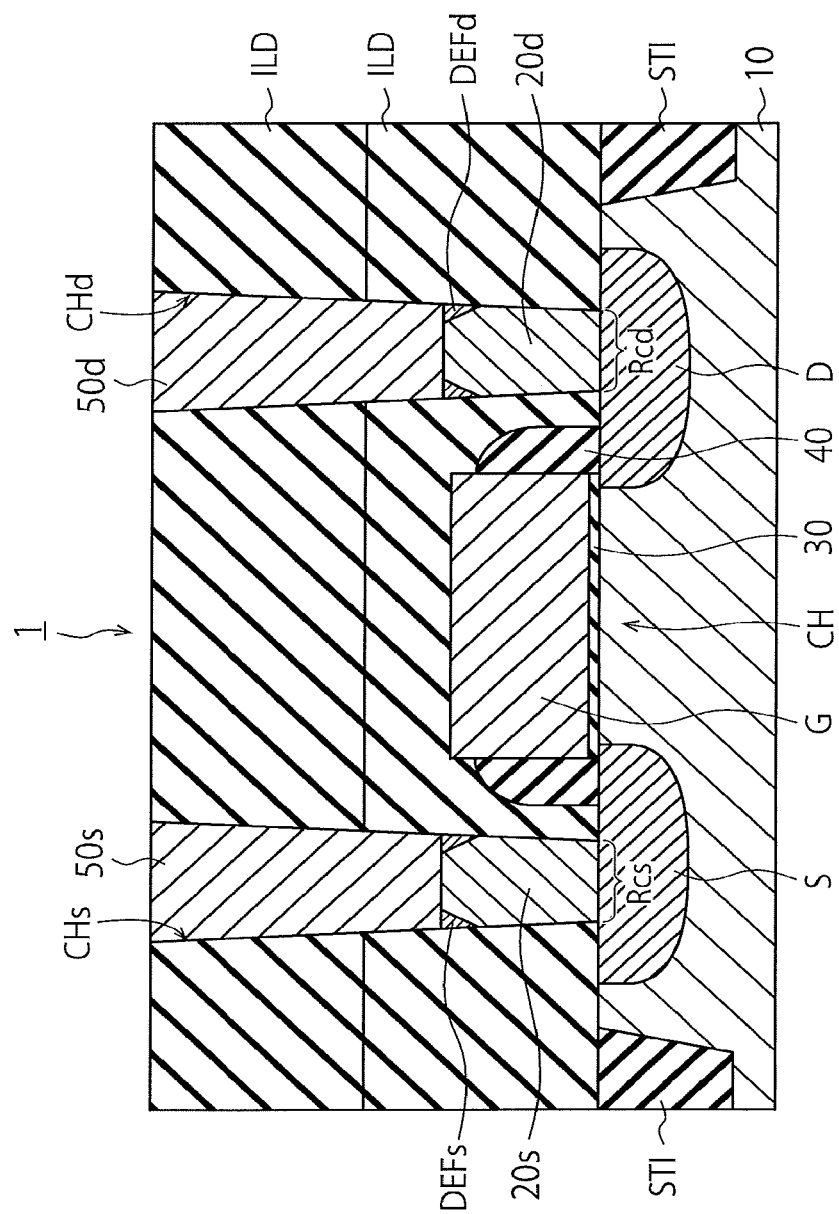
FIG. 2 is a sectional view along a line 2-2 in FIG. 1.

FIG. 2 is a sectional view along a line 2-2 in FIG. 1. Shallow trench isolation parts STI are provided in the surface region of the semiconductor substrate 10. The shallow trench isolation parts STI electrically isolate adjacent active areas from each other and define the active areas.

The transistors 1 are provided above the semiconductor substrate 10 in the active areas. Each of the transistors 1 includes the source layer S, the drain layer D, the gate dielectric film 30, the gate electrode G, the source crystal layers 20s, the drain crystal layers 20d, the source contact plugs 50s, the drain contact plugs 50d, a spacer 40, and an inter-layer dielectric film ILD.

The source layer S and the drain layer D are provided in the surface region of the semiconductor substrate 10 and are formed of an impurity layer as described above. A portion of the surface region of the semiconductor substrate 10 between the source layer S and the drain layer D is the channel region CH. The gate dielectric film 30 is provided on the channel region CH. For example, a silicon dioxide film, or a high dielectric material (such as hafnia) having a higher dielectric constant than that of a silicon oxynitride film or a silicon dioxide film is used as the gate dielectric film 30.

The gate electrode G is provided on the gate dielectric film 30. The gate electrode G is electrically insulated from the semiconductor substrate 10 by the gate dielectric film 30.

Contact holes CHs are provided in a contact region Rcs of the source layer S. The source crystal layers 20s are provided in the corresponding contact holes CHs, respectively. The source contact plugs 50s are provided on the corresponding source crystal layers 20s, respectively.

Contact holes CHd are provided in a contact region Rcd of the drain layer D. The drain crystal layers 20d are provided in the corresponding contact holes CHd, respectively. The drain contact plugs 50d are provided on the corresponding drain crystal layers 20d, respectively.

As described above, an epitaxial layer having impurities introduced therein is used as the source crystal layers 20s and the drain crystal layers 20d. The source crystal layers 20s are electrically connected to the source layer S and respectively form crystal layers integral with the source layer S. The drain crystal layers 20d are electrically connected to the drain layer D and respectively form crystal layers integral with the drain layer D.

The source contact plugs 50s are provided on the corresponding source crystal layers 20s and are in ohmic contact with the source crystal layers 20s, respectively. The drain contact plugs 50d are provided on the corresponding drain crystal layers 20d and are in ohmic contact with the drain crystal layers 20d, respectively.

The spacer 40 is provided on side surfaces of the gate electrode G. An insulating film such as a silicon dioxide film is used as the spacer 40.

The inter-layer dielectric film ILD covers around the transistor 1 to protect the transistor 1. An insulating film such as a silicon dioxide film is used as the inter-layer dielectric film ILD. The contact holes CHs and CHd are provided in the inter-layer dielectric film ILD and the source crystal layers 20s, the drain crystal layers 20d, the source contact plugs 50s, and the drain contact plugs 50d are provided in the corresponding contact holes CHs and CHd.

The source crystal layers 20s are crystal layers raised to a position higher than the surface of the source layer S and distance contact surfaces between the corresponding source contact plugs 50s and the source layer S from the channel region CH. Similarly, the drain crystal layers 20d are crystal layers raised to a position higher than the surface of the drain layer D and distance contact surfaces between the corresponding drain contact plugs 50d and the drain layer D from the channel region CH. This configuration can suppress the short channel effect even when the gate length is shortened by downscaling.

Meanwhile, a high concentration of impurities is introduced into the source crystal layers 20s and the drain crystal layers 20d as in the source layer S and the drain layer D. After semiconductor crystal layers are grown on the semiconductor substrate 10 in the contact regions Rcs and Rcd by an epitaxial growth method, ions of the impurities are implanted into the grown semiconductor crystal layers. For example, ions of boron with a concentration equal to or higher than $10^{16}$ cm$^{-2}$ are implanted into the source crystal layers 20s and the drain crystal layers 20d of a P-type MOSFET. When ions of the impurities are implanted, the respective top parts of the semiconductor crystal layers are damaged and amorphized. The semiconductor crystal layers are thermally treated to recrystallize the amorphized semiconductor crystal layers and to activate the impurities.

When the amorphous layers are recrystallized by thermal treatment, crystals grow toward a crystal orientation <111> while stacking defects DEFs and DEFd remain in a region in the crystal orientation <111>. That is, the amorphous layers recrystallize while having a surface substantially perpendicular to the crystal orientation <111>. At that time, the stacking defects DEFs and DEFd remain in the top end parts of the crystal layers 20s and 20d. The stacking defects DEFs and DEFd contain many defects although being recrystallized from the amorphous state. Therefore, even if the contact plugs 50s and 50d are brought to contact in parts including the stacking defects DEFs and DEFd, the contact resistance cannot be reduced sufficiently. Accordingly, if the proportion of the stacking defects DEFs and DEFd remaining in the respective top surfaces of the crystal layers 20s and 20d is high, the contact resistance between the contact plugs 50s and 50d and the corresponding crystal layers 20s and 20d is increased.

Figure 3:
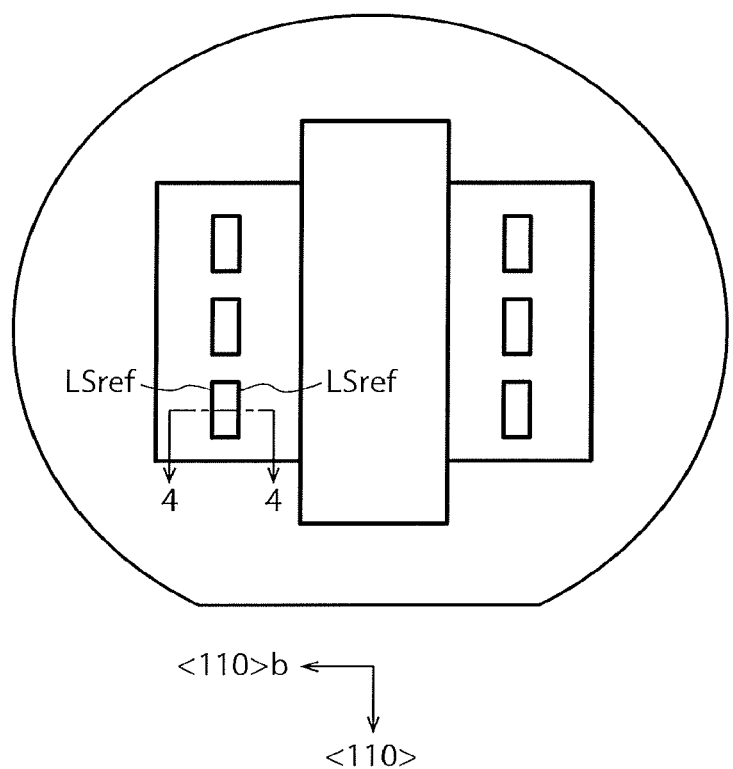
FIG. 3 is a plan view illustrating a configuration of a transistor according to a comparative example.
Figure 4:
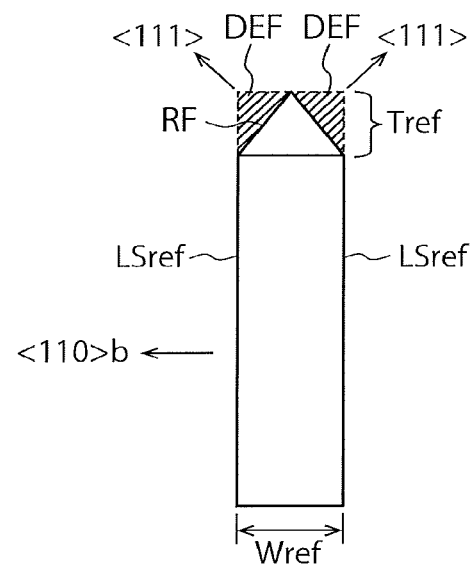
FIG. 4 is a sectional view along a line 4-4 in FIG. 3.

For example, FIG. 3 is a plan view illustrating a configuration of a transistor according to a comparative example. In the comparative example, long sides LSref of each of source crystal layers and drain crystal layers extend in a direction substantially perpendicular to the crystal orientation <110>b (substantially in parallel to the crystal orientation <110>). In this case, the interval between two long sides LSref in the crystal orientation <110>b is relatively narrow. FIG. 4 is a sectional view along a line 4-4 in FIG. 3. That is, FIG. 4 is a sectional view of a source crystal layer in a direction perpendicular to the crystal orientation <110>. The interval between two long sides LSref in the crystal orientation <110>b is a width Wref. While FIG. 4 illustrates the source crystal layer, the same holds true for the drain crystal layer.

A dashed line in FIG. 4 indicates a cross-section of the source crystal layer before impurity introduction. When impurities are introduced, a top part Tref of the source crystal layer is amorphized. When thermal treatment is performed subsequently, the source crystal layer is recrystallized toward the crystal orientation <111>. Therefore, top end parts (angular parts) of the source crystal layer become slopes RF and the top part thereof is tapered into a chevron shape. In this comparative example, because the long sides LSref extend in the direction substantially perpendicular to the crystal orientation <110>b in the planar layout in FIG. 3 as described above, the width Wref between the long sides LSref in the crystal orientation <110>b is narrow as illustrated in FIG. 4. If the width Wref is narrow, the slopes RF remain on the top surface of the source crystal layer and almost no flat region is formed when the source crystal layer is recrystallized toward the crystal orientation <111>. That is, the proportion of the slopes RF in the top surface of the source crystal layer becomes large and the top surface has a shape tapered in a chevron manner as illustrated in FIG. 4. In this case, a high-quality crystal portion containing few defects formed by the recrystallization has a shape tapered in a chevron manner and many stacking defects DEFs and DEFd remain on the both ends thereof. The same holds true for the drain crystal layer.

Figure 5:
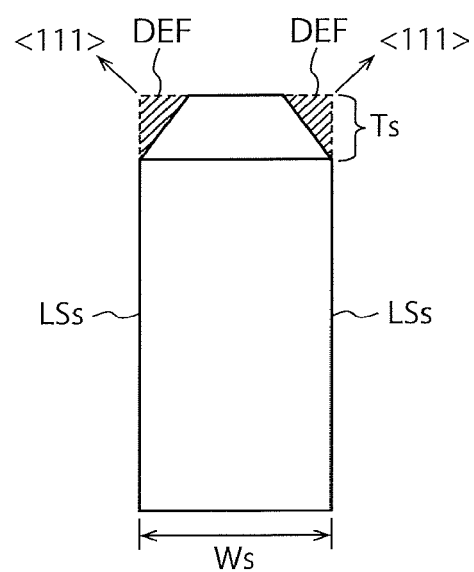
FIG. 5 is a sectional view along a ling 5-5 in FIG. 1.

In contrast thereto, according to the present embodiment, the long sides LSs of each of the source crystal layers 20s and the long sides LSd of each of the drain crystal layers 20d are inclined with respect to the crystal orientations <110>b and <110> in the planar layout as illustrated in FIG. 1. In this case, the interval between two long sides in the direction of the crystal orientation <110>b or <110> is relatively wide. FIG. 5 is a sectional view along a ling 5-5 in FIG. 1. That is, FIG. 5 is a sectional view of the source crystal layer 20s in a direction perpendicular to the crystal orientation <110>. In this case, the interval between the two long sides LSs in the direction of the crystal orientation <110>b or <110> is a width Ws and is larger than the width Wref in FIG. 4. In a cross-section in the direction perpendicular to the surface of the semiconductor substrate 10, the top part of the source crystal layer 20s is substantially trapezoidal. While FIG. 5 illustrates the source crystal layer 20s, the same holds true for the drain crystal layer 20d.

When the impurities are introduced, a top part Ts of the source crystal layer 20s indicated by a dashed line in FIG. 5 is amorphized. When thermal treatment is performed subsequently, the source crystal layer 20S is recrystallized toward the crystal orientation <111>. Therefore, top end parts (angular parts) of the source crystal layers 20s become slopes RF as in the comparative example. However, as illustrated in FIG. 5, the width Ws between the long sides LSs in the direction of the crystal orientation <110>b or <110> is larger than the width Wref in the present embodiment. Accordingly, when the amorphous layers are recrystallized toward the crystal orientation <111>, a wide flat region is formed on the top surface of the source crystal layer 20s as illustrated in FIG. 5 while the slopes RF remain on the both ends on the top surface of the source crystal layer 20s. In this case, the proportion of the flat surface in the top surface of the source crystal layer 20s becomes relatively large and the top part of the source crystal layer 20s becomes substantially trapezoidal. Therefore, the stacking defects DEFs and DEFd remain only on the side surfaces of the source crystal layer 20s and a high-quality crystal portion containing few defects is provided as a flat region on the top surface of the source crystal layer 20s. The same holds true for the drain crystal layer 20d.

This configuration can bring each of the source contacts 50s into contact with a relatively large area of a part of the corresponding source crystal layer 20s containing few crystal defects as illustrated in FIG. 2. Each of the drain contacts 50d also can be in contact with a relatively large area of a part of the corresponding drain crystal layer 20d containing few crystal defects. As a result, even when the transistor 1 is downscaled, the source contacts 50s and the drain contacts 50d can be in contact with the source crystal layers 20s and the drain crystal layers 20d, respectively, with a low resistance.

Second Embodiment

Figure 6:
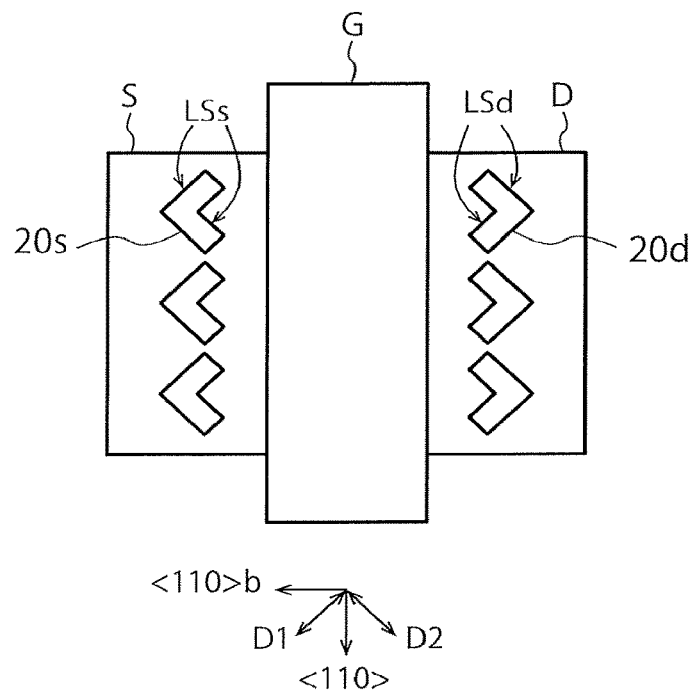
FIG. 6 is a plan view illustrating a configuration example of a transistor according to a second embodiment.

FIG. 6 is a plan view illustrating a configuration example of a transistor according to a second embodiment. According to the second embodiment, the long sides LSs of each of the source crystal layers 20s and the long sides LSd of each of the drain crystal layers 20d extend in a first direction D1 inclined with respect to the crystal orientation <110> and are folded in the middle to a second direction D2 inclined to the opposite side to the first direction D1 with respect to the crystal orientation <110> in a planar layout. That is, in the planar layout, the source crystal layers 20s and the drain crystal layers 20d have a V shape with the crystal orientation <110>b assumed as a lower side or an upper side.

By folding the long sides LSs and LSd in this manner, the long sides LSs and LSd of the source crystal layers 20s and the drain crystal layers 20d can be elongated even if the flat regions of the source layer S and the drain layer D are narrow. This configuration can further increase the contact area between each of the source contacts 50s and the corresponding source crystal layer 20s and the contact area between each of the drain contacts 50d and the corresponding drain crystal layer 20d and can reduce the contact resistance.

The directions of inclination of the long sides LSs and LSd can be identical to those in the first embodiment. Other configurations of the second embodiment can be identical to corresponding configurations of the first embodiment. Therefore, the second embodiment can obtain effects identical to those of the first embodiment.

Third Embodiment

Figure 7:
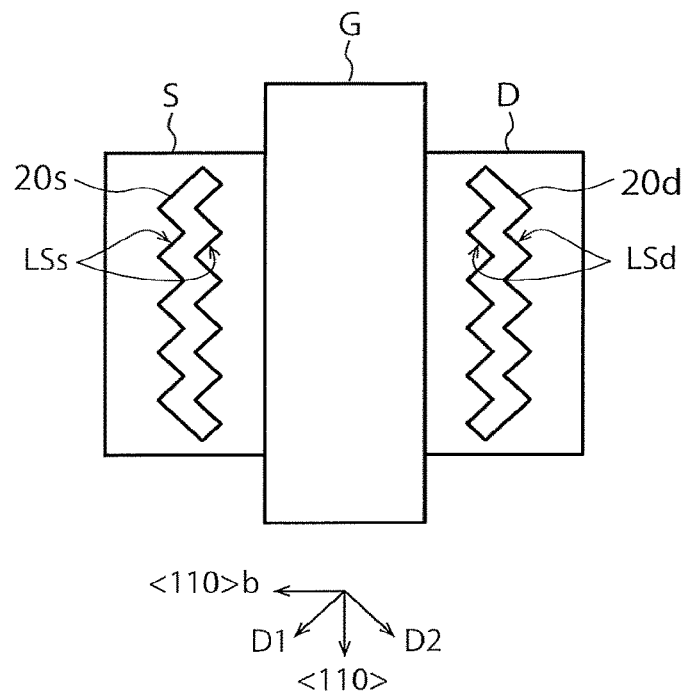
FIG. 7 is a plan view illustrating a configuration example of a transistor according to a third embodiment.

FIG. 7 is a plan view illustrating a configuration example of a transistor according to a third embodiment. According to the third embodiment, the long sides LSs of each of the source crystal layers 20s and the long sides LSd of each of the drain crystal layers 20d are folded in the first direction D1 and the second direction D2 sequentially in a planar layout. That is, in the planar layout, the source crystal layers 20s and the drain crystal layers 20d have a W shape or a zigzag shape with the crystal orientation <110>b assumed as a lower side or an upper side. Therefore, the contact area between each of the source contacts 50s and the corresponding source crystal layer 20s and the contact area between each of the drain contacts 50d and the corresponding drain crystal layer 20d can be further increased and the contact resistance can be reduced.

The directions of inclination of the long sides LSs and LSd can be identical to those in the first embodiment. Other configurations of the third embodiment can be identical to corresponding configurations of the first embodiment. Therefore, the third embodiment can obtain effects identical to those of the first embodiment.

The embodiments described above can be applied to either a P-type MOSFET or an N-type MOSFET. However, when ions of boron are implanted as P-type impurities into the source crystal layers 20s and the drain crystal layers 20d, the stacking defects DEFs and DEFd are likely to occur. Therefore, it is preferable that the embodiments described above be applied to a P-type MOSFET.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
    a semiconductor substrate;
    a source layer and a drain layer located in a surface region of the semiconductor substrate;
    a gate dielectric film located on a channel region between the source layer and the drain layer;
    a gate electrode located on the gate dielectric film;
    a source crystal layer located in a contact region of the source layer to extend to a position higher than a surface of the semiconductor substrate;
    a drain crystal layer located in a contact region of the drain layer to extend to a position higher than the surface of the semiconductor substrate;
    a source contact located on the source crystal layer; and
    a drain contact located on the drain crystal layer, wherein
    a long side or a major axis of the source crystal layer or a long side or a major axis of the drain crystal layer extends in a direction inclined with respect to a crystal orientation <110> of the semiconductor substrate in a planar layout parallel to the surface of the semiconductor substrate.

2. The device of claim 1, wherein the long side or the major axis of the source crystal layer or the long side or the major axis of the drain crystal layer extends in a direction inclined with respect to the crystal orientation <110> at an angle of 45 degrees in the planar layout.

3. The device of claim 1, wherein top parts of the source crystal layer and the drain crystal layer are substantially trapezoidal in a cross-section in a direction perpendicular to the surface of the semiconductor substrate.

4. The device of claim 2, wherein top parts of the source crystal layer and the drain crystal layer are substantially trapezoidal in a cross-section in a direction perpendicular to the surface of the semiconductor substrate.

5. The device of claim 1, wherein the long side or the major axis of the source crystal layer or the long side or the major axis of the drain crystal layer extends in a first direction inclined with respect to the crystal orientation <110> and is folded in middle in a second direction inclined to an opposite side to the first direction with respect to the crystal orientation <110> in the planar layout.

6. The device of claim 2, wherein the long side or the major axis of the source crystal layer or the long side or the major axis of the drain crystal layer extends in a first direction inclined with respect to the crystal orientation <110> and is folded in middle in a second direction inclined to an opposite side to the first direction with respect to the crystal orientation <110> in the planar layout.

7. The device of claim 3, wherein the long side or the major axis of the source crystal layer or the long side or the major axis of the drain crystal layer extends in a first direction inclined with respect to the crystal orientation <110> and is folded in middle in a second direction inclined to an opposite side to the first direction with respect to the crystal orientation <110> in the planar layout.

8. The device of claim 5, wherein the long side or the major axis of the source crystal layer or the long side or the major axis of the drain crystal layer is folded in the first direction and the second direction sequentially in the planar layout.

9. The device of claim 1, wherein the source crystal layer and the drain crystal layer are P-type semiconductors, respectively.

10. The device of claim 2, wherein the source crystal layer and the drain crystal layer are P-type semiconductors, respectively.

11. The device of claim 3, wherein the source crystal layer and the drain crystal layer are P-type semiconductors, respectively.

12. The device of claim 5, wherein the source crystal layer and the drain crystal layer have a V shape in the planar layout.

13. The device of claim 8, wherein the source crystal layer and the drain crystal layer have a W shape in the planar layout.

14. The device of claim 8, wherein the source crystal layer and the drain crystal layer have a zigzag shape in the planar layout.

* * * * *